(12) United States Patent
Mirabella et al.

(10) Patent No.: US 10,374,600 B2
(45) Date of Patent: Aug. 6, 2019

(54) HIGH-VOLTAGE SWITCHING CIRCUIT, CORRESPONDING DEVICE AND METHOD

(71) Applicant: STMicroelectronics S.r.l., Agrate Brianza (IT)

(72) Inventors: Ignazio Bruno Mirabella, Ragusa (IT); Agatino Antonino Alessandro, Riposto (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 16/122,262

(22) Filed: Sep. 5, 2018

(65) Prior Publication Data

US 2019/0074830 A1 Mar. 7, 2019

(30) Foreign Application Priority Data

Sep. 7, 2017 (IT) .......................... 102017000100380

(51) Int. Cl.

| | |
|---|---|
| *H03K 17/284* | (2006.01) |
| *H03K 5/24* | (2006.01) |
| *H03K 17/081* | (2006.01) |
| *H03K 19/20* | (2006.01) |
| *H03K 3/037* | (2006.01) |
| *H03K 5/153* | (2006.01) |
| *H03K 17/08* | (2006.01) |

(52) U.S. Cl.
CPC .......... *H03K 17/284* (2013.01); *H03K 3/037* (2013.01); *H03K 5/153* (2013.01); *H03K 5/24* (2013.01); *H03K 17/08104* (2013.01); *H03K 19/20* (2013.01); *H03K 2017/0803* (2013.01)

(58) Field of Classification Search
None
See application file for complete search history.

(56) References Cited

U.S. PATENT DOCUMENTS

| | | |
|---|---|---|
| 5,140,174 A | 8/1992 | Meier et al. |
| 6,437,625 B1 | 8/2002 | Kojima et al. |
| 6,693,458 B1 * | 2/2004 | Barrow .................... H03K 5/24 |
| | | 326/104 |
| 10,033,273 B1 * | 7/2018 | Chen ..................... H02M 3/156 |
| 2004/0085088 A1 | 5/2004 | Marshall et al. |

OTHER PUBLICATIONS

IT Search Report and Written Opinion for IT Appl. No. 102017000100380 dated Apr. 30, 2018 (10 pages).

* cited by examiner

*Primary Examiner* — Jeffery S Zweizig
(74) *Attorney, Agent, or Firm* — Crowe & Dunlevy

(57) ABSTRACT

First and second comparators receive input signals of opposed polarities and drive operation of a switch in response thereto. A first current generator supplies a first current to the switch which, in response to the control of the first and second comparators, applies the first current, alternatively, to a first node or a second node. A second current generator sinks a second current from the first node and a third current generator sinks a third current from the second node. A logic circuit has inputs coupled to the first node and the second node, respectively, receives respective switching signals having fast switching wavefronts and delayed switching wavefronts. The output of logic circuit is configured for switching between a first state and a second state with switching between the first state and the second state triggered by the fast switching wavefronts of the respective switching signals.

18 Claims, 5 Drawing Sheets

HIGH-VOLTAGE SWITCHING CIRCUIT, CORRESPONDING DEVICE AND METHOD

PRIORITY CLAIM

This application claims the priority benefit of Italian Application for Patent No. 102017000100380, filed on Sep. 7, 2017, the content of which is hereby incorporated by reference in its entirety to the maximum extent allowable by law.

TECHNICAL FIELD

The present description relates to switching circuits.

One or more embodiments may apply to monolithic integrated circuits (ICs) intended to operate under critical conditions such as, for example:
- high-voltages (up to 200V DC);
- variable environment temperature;
- floating grounds such as those used in certain space applications or medical devices; and/or
- continued exposure to ionizing radiation (for example, with a certain Total Ionizing Dose—T.I.D.) as may again be the case for space applications and medical devices.

BACKGROUND

In certain circuits such as monolithic integrated circuits a possible lack of symmetry in switching wavefronts can be observed.

This may be related to various factors such as:
- statistical mismatch between different silicon wafers due to the production process, which may cause a certain electronic component to behave differently from others;
- intrinsic design and/or simulation errors due to the non-ideal behavior of circuit layouts and the models of elementary components;
- architectural lack of symmetry due, for example, to differential input offsets, mirror errors, non-zero output resistance values of voltage generators, complexity in the architectures adopted for implementing a high-voltage components;
- lack of symmetry due to temperature variations which affect circuit behavior due to changes in electrical conductivity of the components;
- variations in reference and/or supply voltages which may change the bias conditions of components and node dynamics as well, by affecting gain and speed; and/or
- variations in the electrical parameters of the elementary components due to continued absorption of ionizing radiation (T.I.D.).

SUMMARY

Despite the extensive activity in that area, further improved solutions are still desirable.

One or more embodiments may relate to a corresponding device (for example, for use in space or medical applications as mentioned previously) and a corresponding method.

The claims are an integral part of the technical teaching provided herein in respect of the embodiments.

One or more embodiments may offer one or more of the following advantages:
- wide input voltage dynamics,
- fast switching times,
- symmetry in switching wavefronts,
- ease of implementation,
- possibility of using high-voltage components which per se would not be particularly performing when exposed to ionizing radiation (T.I.D.).

In an embodiment, a circuit comprises: a first comparator and a second comparator having respective differential inputs configured for receiving input signals of opposed polarities, the first comparator and the second comparator having respective output nodes; a first reference current generator; a switch driven by the output nodes of the first comparator and the second comparator, the switch coupled to the first reference current generator to transfer the current of the first reference current generator alternatively between the first reference current generator and a first node or between the first reference current generator and a second node; a pair of second reference current generators coupled to the first node and the second node, respectively, wherein the current of the second reference current generators in the pair of second current generators is applied to the first node and the second node with a sign opposite to the sign of the current of the first reference current generator; a logic circuit having a first input and a second input coupled to the first node and the second node, respectively, to receive therefrom respective switching signals each of the respective switching signals having fast switching wavefronts and delayed switching wavefronts, the logic circuit including an output node and being configured for switching between a first state and a second state of the output node with switching between the first state and the second state triggered by the fast switching wavefronts of said respective switching signals.

The current of the second reference current generators in the pair of second current generators may have an intensity half the current intensity of the first reference current generator.

The logic circuit comprises: a first pulse generator and a second pulse generator coupled with the first input and the second input of the logic circuit, and a latch circuit having set and reset inputs driven by the first pulse generator and the second pulse generator.

The first comparator and the second comparator may be coupled to a first circuit ground, and the pair of second reference current generators and the logic circuit may be coupled to a second circuit ground, the second circuit ground floating with respect to the first circuit ground.

In one or more embodiments, the first input and the second input of the logic circuit may be coupled to the first node and the second node via logical inverter circuits.

In one or more embodiments, the second reference current generators in the pair of second reference current generators may be coupled with respective voltage-limiting zener diodes.

In one or more embodiments, the first pulse generator and the second pulse generator may include low-pass circuits controlling the duration of the set and reset pulses applied to the set and reset inputs of the latch circuit.

In one or more embodiments, the first pulse generator and the second pulse generator may include NAND logic gates with a first input configured for receiving said respective switching signals and a second input configured for receiving delayed replicas of said respective switching signals.

In one or more embodiments, the first pulse generator and the second pulse generator may include a low-pass network coupled to the second inputs of the NAND logic gates to low-pass filter said delayed replicas.

In an embodiment, a device comprises: a circuit as described above, and a user circuit coupled to the output node wherein switching of the output node between a first state and a second state is substantially unaffected by the delayed switching wavefronts of said respective switching signals.

A method of operating a circuit or device according to one or more embodiments may include applying to the differential inputs of the first comparator and the second comparator input signals of opposed polarities including a DC signal (e.g. INM) having superposed thereon a square wave signal (e.g. INP).

Without prejudice to the underlying principles, the details and embodiments may vary, even significantly, with respect to what has been described by way of example only without departing from the extent of protection.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Tests were run with the nuclear research center CEA-Saclay of Paris (France) by using a Co60 gamma ray source on certain integrated circuits produced by using BCD6s SOI technology. This is a proprietary process technology which enables the combination of low-voltage CMOS logic, precise analog circuitry and robust power stages on the same chip.

The tests had the primary aim of investigating the effect of a radiation absorbed by elementary electronic components.

Tests performed on high-voltage (30V) MOS devices with a dose absorbed between 0 and 100 Krad have shown that, as a result of ionization effects:
- N-channel MOS devices exhibit a reduced threshold voltage,
- P-channel MOS devices exhibit an increased threshold voltage, and
- a leakage current of about $\mu A$ ($10^{-6}$ A) is generated started from the drain terminal.

It was also observed that the offset generated in the threshold voltages may have different effects, which may introduce a further mismatch in propagation times and in rise and fall signal edges (that is in the switching wavefronts).

This was found to be particularly the case for switching architectures such as inverters, comparators and level shifters.

Figure 1:
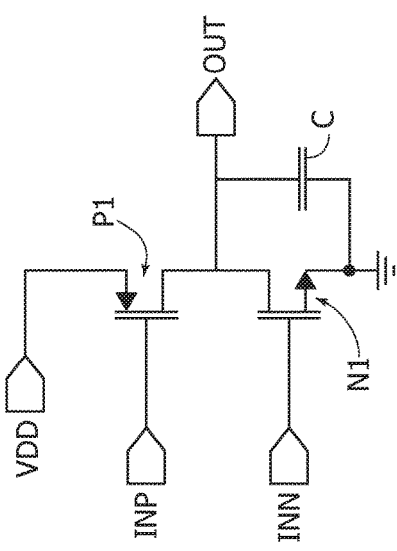
FIGS. 1 to 3 are elementary circuit diagrams exemplary of inverter stages.

FIG. 1 is a representation of a high-voltage inverter including a P-channel high-voltage MOSFET transistor (PMOS) P1 and N-channel high-voltage MOSFET transistor (NMOS) N1 with their current paths (source-drain) arranged in series between a supply voltage VDD and ground.

In such an inverter a shift of the switching thresholds from 1.5V to 0.6V was observed at the gate terminals INP, INN. These variations affect directly the output signal OUT (taken at the intermediate point between the two transistors P1 and N1 across an output capacitor C) during the switching phases with the rising edge or wavefront delayed and the falling edge or wavefront anticipated.

In a high-voltage switching system as exemplified in FIG. 1:
- the first transistor P1 has its source at the voltage VDD and its gate is driven with a voltage INP higher than VTh_PMOS,
- the second transistor N1 has its source referred to ground and its gate is driven with a voltage INN higher than the voltage VTh_NMOS (referred to ground).

As noted, the drain terminals of the two transistors P1, N1 are connected together to provide the inverter output OUT, with the capacitor C arranged in parallel to the output exemplary of a load adapted to be actuated by the inverter.

The MOS transistors P1, N1 can be dimensioned in such a way the switching point of the inverter is centered at VDD/2.

When a low-voltage ("0" logical level) is applied to the gates of the transistors P1, N1, the output OUT reaches the value of the supply voltage VDD but for a (small) voltage drop between drain and source of the transistor P1.

Conversely, when a high-voltage ("1" logical level) is applied to the gates of the transistors P1, N1, the output OUT reaches a level close to ground but for a (small) voltage drop between drain and source of the transistor N1.

Current dissipation takes place in the MOS transistors P1, N1 during logical level transitions (switching). In static conditions, the dissipated currents are virtually nil (current leakage).

During switching the capacitor C is charged with a time constant given by the product of the drain resistance of the transistor P1 by the capacitance of C, and is discharged with a time constant given by the product of the drain resistance of the transistor N1 by the capacitance of times C.

Acting on the length and the width parameters of the MOS transistors P1, N1 makes it possible to render the switching wavefronts (more) symmetrical. Factors such as lack of symmetry in the manufacturing process, modeling and so on (as discussed previously), may cause the output signals to be insufficiently symmetrical during the switching wavefronts.

Figure 2:
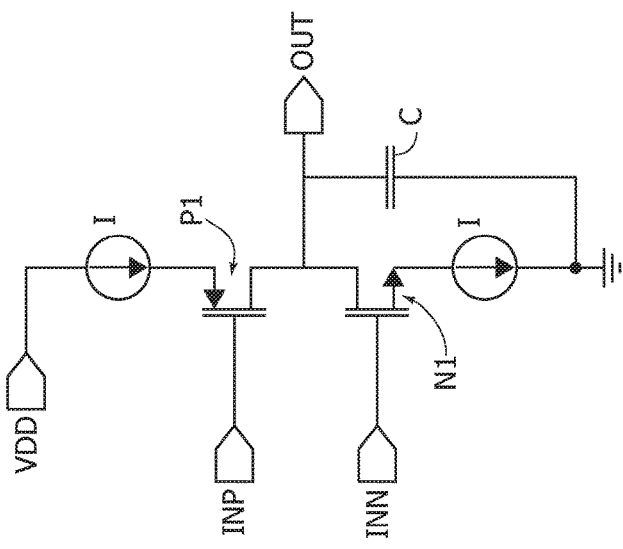
Figure 3:
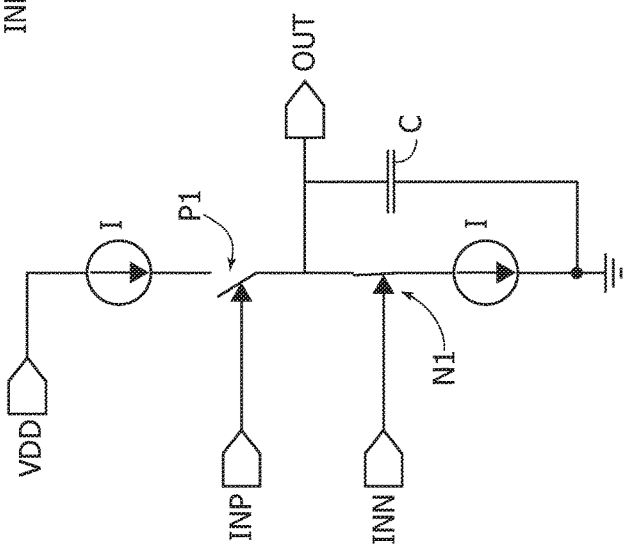

That issue may be attempted to be addressed by resorting to the circuit layout exemplified in FIGS. 2 and 3.

In FIGS. 2 and 3 parts or elements like parts or elements already discussed in connection with FIG. 1 are indicated with like references, thus making it unnecessary to repeat a corresponding description.

In the solution of FIGS. 2 and 3 the charge and discharge process of the output is controlled by means of two constant current generators which produce a same current intensity I and are arranged between the supply voltage node VDD and the first transistor P1 and between the second transistor N1 and ground, respectively.

As highlighted in FIG. 3, in the solution of FIG. 2, the two transistors P1, N1 essentially act as switches with the aim of making switching independent of the channel resistances of the transistors P1 and N1.

The possibility thus exists of adjusting the current inverter in order to obtain a certain relationship between the output voltage and the propagation delay of the signals.

In fact, the current I charges the capacitor C in a linear manner at a charge Q with a voltage VOUT across the capacitor C so that the charge/discharge delay can be calculated based on the following relationships:

$$VOUT\_P1 = Q/C$$

$$VOUT\_N1 = Q/C$$

(where VOUT_P1 and VOUT_N1 indicate the output voltage due to the node OUT in FIG. 3 being charged/discharged);

$$Q1\_P1 = I \times t$$

$$Q1\_N1 = I \times t$$

(the charge/discharge of the output node depends on the constant current generator(s) I per time unit t).

By combining the equations above one obtains:

$$t1 = VOUT\_P1 \times C/I$$

$$t2 = VOUT\_N1 \times C/I$$

where t1 and t2 denote the charge/discharge times of the output, which shows that, if the current generators are constant, the capacitor C has equal charge and discharge times.

This means that the voltage across the capacitor which (continuously) switches to VDD or GND has a minimum period bound by the condition:

$$T1min > 2 \times VDD \times C/I$$

$$T2min > 2 \times VDD \times C/I$$

Documents such as U.S. patent application Ser. No. 15/596,465 (claiming priority to Italian patent application No. 102016000123267 filed on Dec. 5, 2016), incorporated by reference, describe floating ground systems, that is systems where a ground SGND of the input signal to the system is expected to be capable of floating (e.g. ±5V or more) with respect to a ground PGND of an associated power section.

Figure 4:
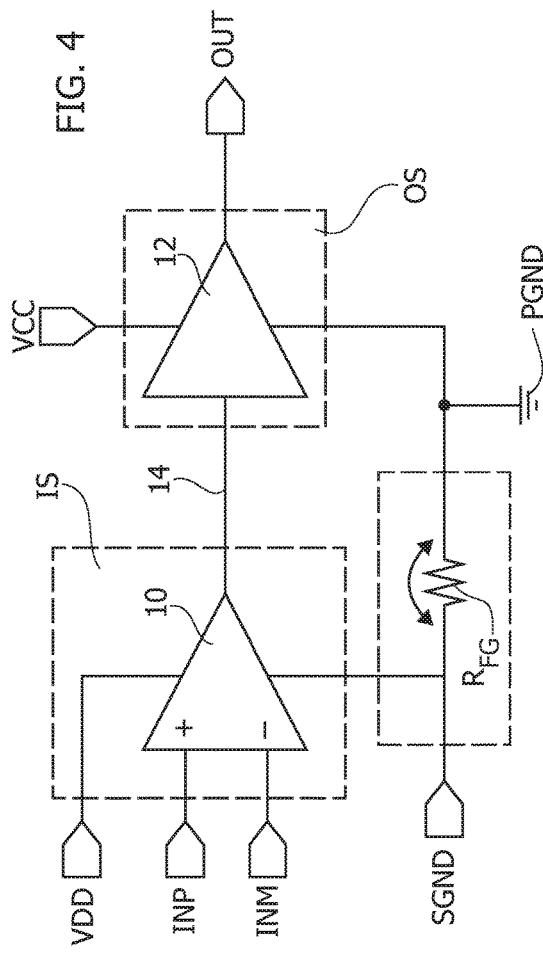
FIGS. 4 and 5 are exemplary of floating ground circuit architectures.

One such system is exemplified in FIG. 4.

In FIG. 4 reference 10 indicates as a whole a (high-voltage) comparator (essentially corresponding to a layout as exemplified in FIGS. 1 to 3) with a supply line or node VDD. The comparator 10 is included in an input stage IS in a system further including an output stage 12 with a (high-voltage) supply line or node VCC. The output stage 12 stage is driven by the input stage 10 via a line 14.

In the system of FIG. 4 the input ground SGND is capable of floating with respect to the power ground PGND as exemplified by a floating ground resistor $R_{FG}$.

Such an approach may be adopted in various contexts, such as:
  space applications, including devices which communicate with control systems having floating grounds, such as Integrate Current Limiter—ICL telemetry controls),
  power switching systems, where the switching currents on the power ground may be the source of noise in the signal grounds and thus produce undesired logic state changes in the input signals (these phenomena are known as "ground bounce"),
  low-voltage circuit blocks intended to be rendered robust to noise with respect to the circuit blocks which are supplied with high-voltages; this may be the case of operational amplifiers or voltage regulators which supply loads with (very) high input currents; and
  high-voltage level shifters or inverters.

A layout as exemplified in FIG. 4 makes it possible to compare signals above or below the power ground PGND and transfer the result to a logic circuit block referred to the power ground PGND of the system.

It was observed that in floating ground systems, where the references for the grounds change, layouts as exemplified in FIGS. 2 and 3 cannot be applied insofar as one of the switches, namely one of the MOS transistors P1, or N1 is missing. Also, an intrinsic limitation of a layout as exemplified in FIG. 4 was found to lie in the supply conditions and the architecture of the circuit blocks.

Figure 5:
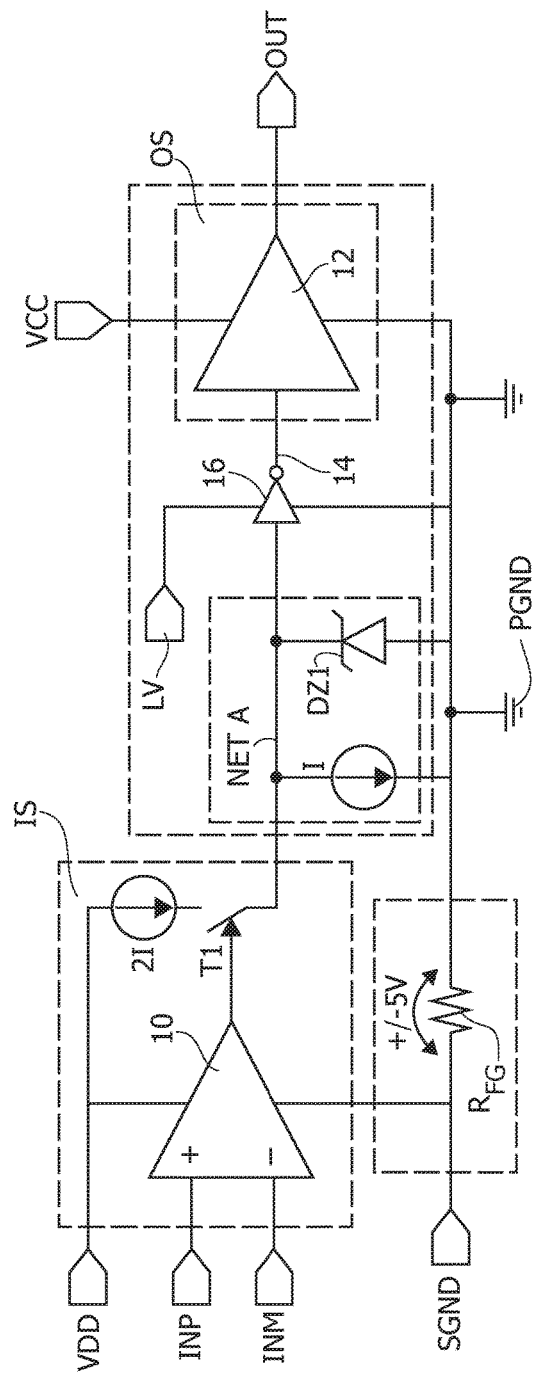

This point can be further elaborated with reference to the circuit diagram of FIG. 5.

In the diagram of FIG. 5 parts or elements like parts or elements already discussed in connection with FIG. 4 are indicated with like references. A corresponding detailed description will not be repeated here for brevity.

Specifically, in a layout as exemplified in FIG. 5, the high-voltage comparator 10 compares the signals at the inputs INP, INM and activates or de-activates correspondingly a switch T1 to couple a line/node designated NET A with a current generator (hereinafter designated simply "generator 2I" for brevity) in the input stage IS (supply line VDD) which generates a current of intensity 2I.

The line/node NET A may be included in a low-voltage stage with an associated current reference generator (hereinafter designated simply "generator I" for brevity) of intensity I.

If the switch T1 is open (that is non-conductive) NET A will discharge with a time constant depending on the current I of the associated reference generator (always) active on the line NET A.

Conversely, with the switch T1 closed (that is conductive), the line NET A will charge with a constant current I=2I–I, given by the difference between the current of intensity 2I injected into NET A by the generator in the input stage IS and the current of intensity I drained from NET A by the reference generator (which is referred to the "power" ground PGND).

A zener diode DZI can be coupled across the current generator I with the purpose of protecting the low-voltage circuitry located downstream of NET A (e.g. a logic network 16 providing the signal on the line 14 and supplied for example with a low-voltage LV of 3V).

It will be otherwise appreciated that the line 14 can be applied to a low-voltage system (e.g. processors, memories) as well as to a power system as exemplified here by the outlet stage 12.

It was observed that a layout as exemplified in FIG. 5 may suffer from a drawback related to the intensity 2I of the current of the generator in the input stage being a function of the voltage VDD and mirrored via PMOS transistors.

Conversely, the current generator I in the low-voltage block associated with NET A is not dependent on the input stage IS from the architectural viewpoint. For instance, the generator I can be implemented by means of NMOS transistor current mirrors which, at least notionally, can be different from the technological viewpoint with respect to the electronic components included in the input stage IS.

Especially in the case of environments exposed to ionizing radiation (T.I.D.), these current mirrors can be the source of additional lack of symmetry in operation of the system.

For instance in cases where (these values are merely exemplary and are not to be construed even indirectly, as limiting for the embodiments):
VDD=20V
LV=3V,
input INM set at a fixed reference equal to 1V,
differential input INP switched between 0.9V and 1V at a frequency of 1 MHz, the variations in threshold voltages of the MOS transistors in the comparator 10 (see e.g. the diagrams of FIGS. 1 to 3) resulting from exposure to ionizing radiation (T.I.D.) may lead to a marked lack of symmetry (propagation delays) of the differential inputs INM, INP and the line 14.

For instance, when switching from a "low" logic level to a "high" logic level delay of 10 ns (1 ns=$10^{-9}$s) can be encountered in contrast with a delay of 64 ns (1 ns=$10^{-9}$s) when switching from a "high" logic level to a "low" logic level.

Figure 6:
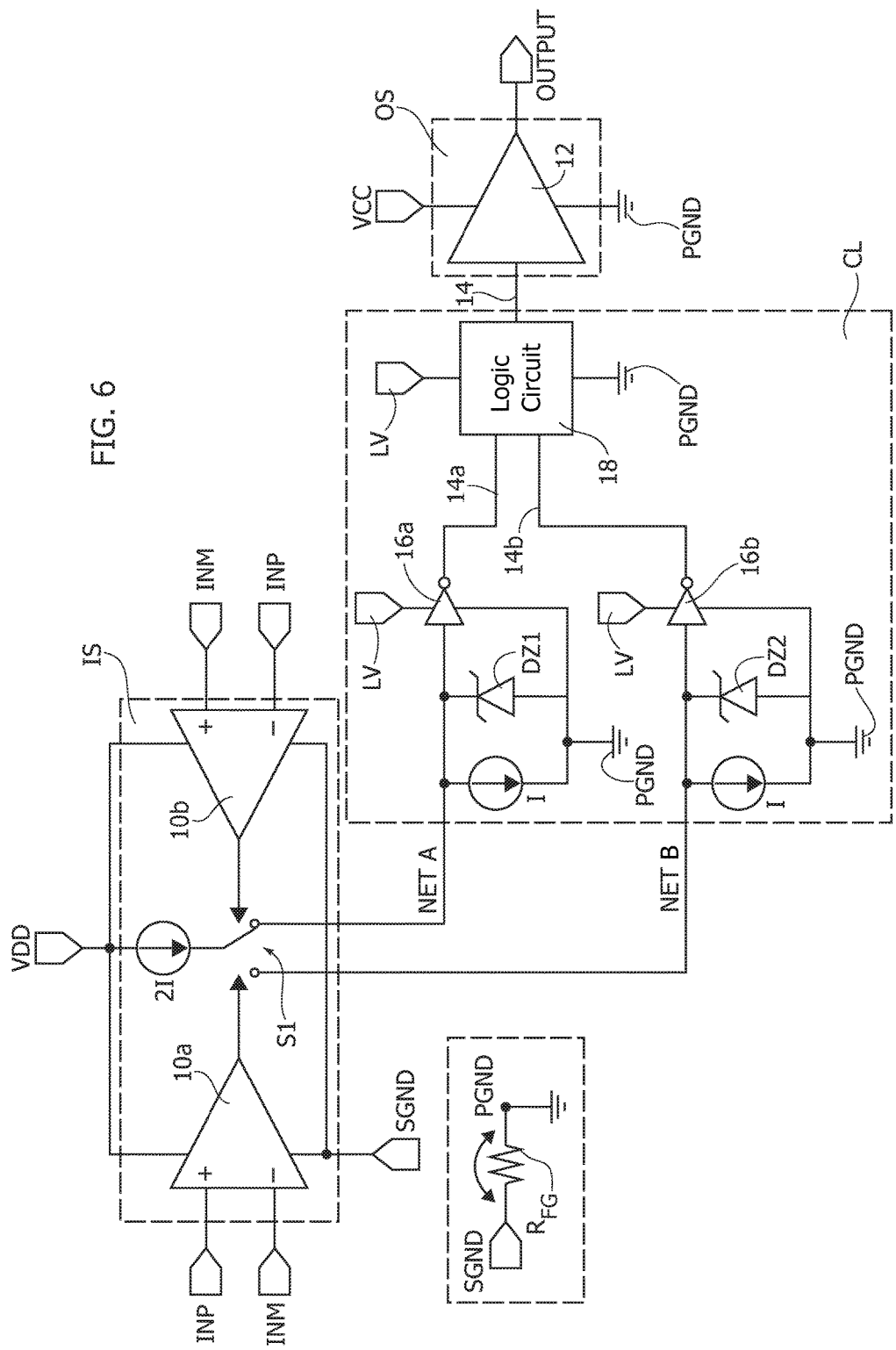
FIG. 6 is a circuit diagram exemplary of embodiments.

In one or more embodiments, those issues can be addressed by resorting to a circuit architecture as exemplified in FIG. 6.

Once again, in FIG. 6, parts or elements like parts or elements already described in connection with FIGS. 1 to 5 are indicated with like references, and a corresponding description will not be repeated for brevity.

In one or more embodiments as exemplified in FIG. 6, the input stage IS includes:
two (high-voltage) comparators 10a, 10b provided with "complementary" inputs INP and INM (see also below) both referenced to the signal ground SGND,
a current generator 2I as discussed previously, coupled to the supply node VDD,
a two-way switch S1 coupled to the current generator 2I, the switch S1 being controlled by the outputs of the comparators 10a, 10b.

In one or more embodiments, the comparators 10a, 10b may include layouts as exemplified in FIGS. 2 and 3.

In one or more embodiments as exemplified in FIG. 6 a (low-voltage) control logic CL circuit block is provided between the input stage IS and the output stage OS.

The control logic CL can be regarded as a sort of duplicated replica of the low-voltage block between the input stage IS and the output stage OS as exemplified in FIG. 5.

In one or more embodiments as exemplified in FIG. 6 the control logic CL includes two lines/nodes NET A, NET B coupled to the outputs of the two-way switch S1, so that the current from the generator 2I is directed towards NET A or towards NET B according to the position of the switch S1, which in turn depends on the (complementary) outcomes of the comparisons in the comparators 10a, 10b.

Two inverters 16a, 16b (essentially corresponding to the inverter 16 of FIG. 5) coupled to NET A and NET B, provide respective output signals on two lines 14a, 14b acting as input lines to a logical circuit 18 (to be discussed in the following, e.g. with reference to FIG. 8) which in turn provides a respective signal over the line 14 towards the output stage OS.

The inputs of the inverters 16a, 16b corresponding to NET A and NET B have associated current generators I and zener diodes DZ1, DZ2 duplicating the circuit layout already discussed in connection with FIG. 5: that is, the two zener diodes DZ1 and DZ2 coupled in parallel to the generators I have the function of limiting the peak values of the voltages on NET A and NET B to e.g. 3V in order to protect the circuits located downstream.

It will be noted that the current generators I are again referred to the "power" ground PGND and have a current intensity (I) which is half the intensity (2I) of the current from the generator in the input stage IS.

Once again, the generator 2I (input stage IS) and each of the generators I apply their currents to NET A and NET B with a opposite signs, e.g. in the case exemplified herein the reference current generator of intensity 2I "pumps" or "injects" current into NET A or into NET B (depending on the position of the switch S1) and the reference current generators of intensity I "draw" (continuously) current from NET A and NET B, irrespective of the position of the switch S1.

The control logic circuit block CL is intended to operate with low-voltage supply terminals LV (e.g. at 3V) and is referred to the power ground PGND.

In one or more embodiments signals are applied to the input terminals INP and INM of the comparator stages 10a, 10b in a complementary manner.

This is exemplified in FIG. 6 by showing:
the terminal INP coupled to the non-inverting input in the comparator 10a and to the inverting input of the comparator 10b,
the terminal INM coupled to the inverting input in the comparator 10a and to the non-inverting input of the comparator 10b.

Comparison between the signals at the inputs of the comparators 10a, 10b has the effect of causing the switch S1 to "steer" the current reference represented by the generator 2I towards either of NET A and NET B in the (low-voltage) control logic CL.

Consequently at NET A and NET B a sum—with sign, namely a difference—is available of the currents from the reference generator 2I (referred to the signal ground SNGD) and the currents from the reference generators I (both referred to the power ground PGND), with these reference generators optionally capable of generating a current which may have a value I that is, for example, half the value of 2I, so that, if the sum of the currents from NET A and NET B is higher than the sum of the incoming currents one has a "0" logic state; otherwise a "1" logic state occurs.

In one or more embodiments, the two generators (of intensity I) in the control logic CL act on NET A, resp. NET B continuously. Conversely, the effect of the reference generator in the input stage IS (of intensity 2I) is felt alternatively in NET A or in NET B, depending on the position of the switch S1, which in turn is a function of the input signals from the comparators 10a, 10b.

Through the inverters 16a, 16b the signals on NET A and NET B are sent to a logic block 18 which processes them to generate a resulting signal which is supplied to the line 14 and on towards other circuits such as the output stage OS. As noted, these circuits arranged downstream of the (low-voltage) logic block CL may be either low-voltage or high-voltage as is the case of the output stage OS exemplified herein.

The effects of ionizing radiation on the MOS components in the high-voltage comparators 10a, 10b with VDD at 20V and the logic circuit block CL supplied at 3V were simulated with respective signals V(INM) at 1V and a signal V(INP)=(1V±100 mV), this latter signal being in the form of a square wave with frequency of 1 MHz, applied to the inputs INP and INM.

Figure 7A:
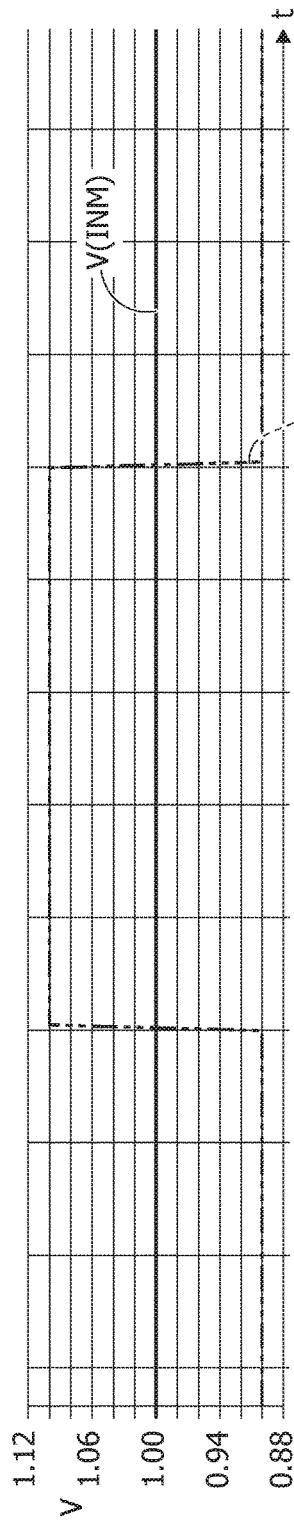
FIGS. 7a, 7b and 7c respectively show exemplary waveforms for possible operation of embodiments.
Figure 7B:
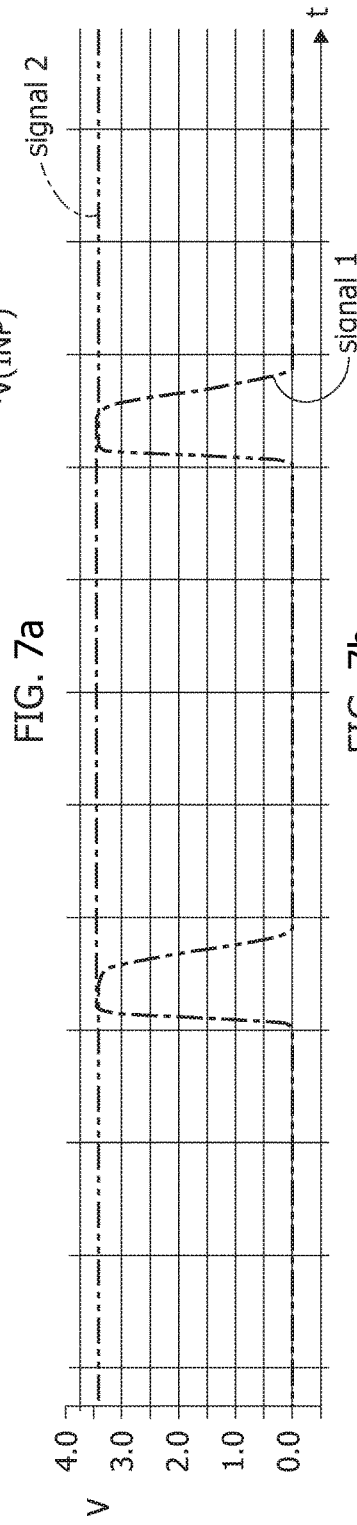
Figure 7C:
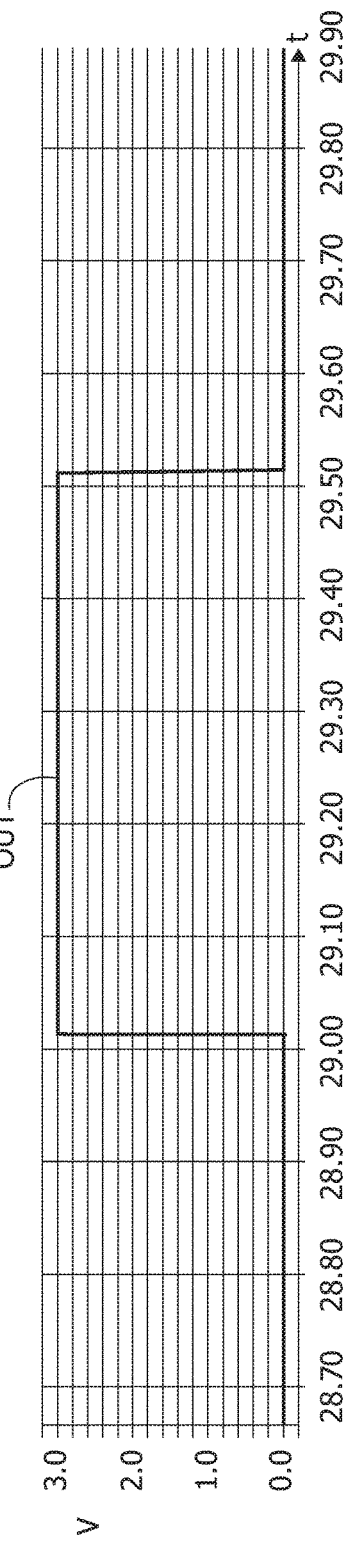

FIGS. 7a, 7b and 7c show waveforms that are exemplary of results obtained by applying to an architecture as exemplified in FIG. 6 input signals as described having the (purely exemplary) parameters cited above.

Applying to a circuit layout as exemplified in FIG. 6 input signals V(INM) and V(INP) as exemplified in FIG. 7a, was found to lead to two wavefronts, namely a fast one, with a delay of 10 ns (1 ns=$10^{-9}$s), and a delayed one, with a delay of about 66 ns (1 ns=$10^{-9}$s) for one of the comparators 10a, 10b, with a complementary arrangement of wavefronts, with delays of 66 ns and 10 ns (1 ns=$10^{-9}$s) for the other of the comparators 10a, 10b.

This behavior is exemplified in FIG. 7b by the two chain lines designated signal 1 and signal 2.

Once processed at 18 (e.g. as discussed in the following) these signals (as available on the lines 14a, 14b at the output of the inverters 16a, 16b) may lead to a signal on the line 14 having two "fast" wavefronts, e.g. with a delay of about 11.5 ns (1 ns=$10^{-9}$s) which are essentially symmetrical, e.g. with a delay difference less than 0.1 ns (1 ns=$10^{-9}$s): this behavior is exemplified in portion c) of FIG. 7 by the line designated OUT.

One or more embodiments may thus rely on the use of two comparator circuits (e.g. 10a, 10b) to which differential signals of opposed polarities are applied.

Figure 8:
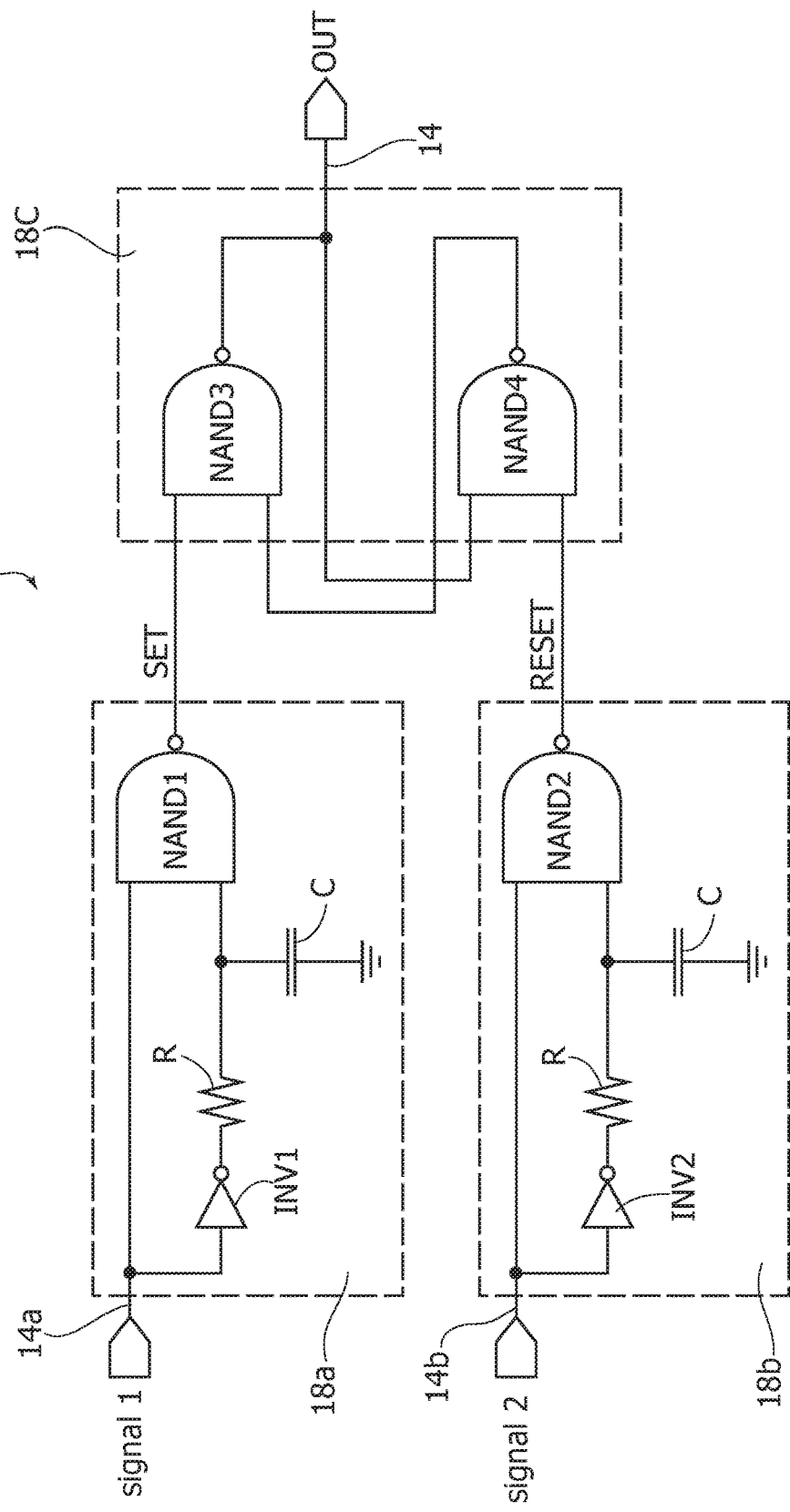
FIG. 8 is a circuit diagram exemplary of a possible implementation of certain circuit blocks in embodiments.

FIG. 8 is exemplary of a possible implementation of the control logic CL and, more specifically, of the logic block 18 receiving the signals signal 1 and signal 2 over the lines 14a, 14b.

In one or more embodiments as exemplified in FIG. 8, the signals signal 1, signal 2 are fed to pulse generators 18a and 18b to produce respective pulse signals SET and RESET.

Each pulse generator 18a, 18b includes a NAND logic gate NAND1 resp. NAND2 which receives a respective input signal (signal 1 or signal 2) both directly (on one input) and indirectly (on the other input) via an inverter INV1 resp. INV2. Such an inverter INV1 or INV2 provides a delayed version of the input signal, signal 1 or signal 2, and is followed by a low-pass filter (e.g. a low-pass filter including a resistor R and a capacitor C), thus providing a delay of e.g. about 50 ns (1 ns=$10^{-9}$s).

In passing from a "low" logic level ("0") to a "high" logic level ("1"), the output of the NAND gate (NAND1, NAND2, respectively) will reach a high logic level to then change state when the signal from the RC low-pass filter falls below the switching threshold of the associated input of the NAND logic gate.

In one or more embodiments, the output signals from the logic gates NAND1, NAND2 can be used as set and reset signals for a latch stage 18c including two further NAND gates NAND3, NAND4.

Each one of the two NAND gates NAND3, NAND4 in the latch 18c has one input receiving the signal SET resp. RESET from the pulse generator 18a resp. 18b and the other input coupled in a cross-wise fashion to the output of the other NAND gate. In that way, the output of the gate NAND 3 (which is coupled to the input of the gate NAND4 other than the one receiving the signal RESET from the pulse generator 10b) can be used to provide the signal on the line 14 (e.g. towards the output stage OS).

The RC filter in the pulse generators 18a, 18b can be dimensioned in such a way that the pulse generated thereby has a width and amplitude adequate to cause switching of the latch 18c as desired by taking into account possible negative effects due to mismatching, temperature, process phenomena and the total amount of ionizing radiation accumulated.

In one or more embodiments, a circuit may include:
  a first comparator (e.g. 10a) and a second comparator (e.g. 10b) having respective differential inputs configured (e.g. INP, INM, resp. INM, INP) for receiving input signals of opposed polarities, the first comparator and the second comparator having respective output nodes,
  a first reference current generator (e.g. 2I),
  a switch (e.g. S1) driven by the output nodes of the first comparator and the second comparator, the switch coupled to the first reference current generator to transfer the current of the first reference current generator alternatively between the first reference current generator and a first node (e.g. NET A) or between the first reference current generator and a second node (e.g. NET B),
  a pair of second reference current generators (e.g. I), coupled to the first node and the second node, respectively, wherein the current of the second reference current generators in the pair of second current generators is applied to the first node and the second node with a sign opposite to the sign of the current of the first reference current generator (e.g. with the current of the generator 2I injected into NET A or NET B and the currents of the generators drawn from NET A and NET B),
  a logic circuit (e.g. 18) having a first input (e.g. 14a) and a second input (e.g. 14b) coupled (e.g. at 16a, 16b) to the first node and the second node, respectively, to receive therefrom respective switching signals (e.g. signal 1, signal 2 in FIG. 8) each of the respective switching signals having fast switching wavefronts and delayed switching wavefronts, the logic circuit including an output node (e.g. 14) and being configured for switching between a first state and a second state of the output node with switching between the first state and the second state triggered by the fast switching wavefronts of said respective switching signals.

In one or more embodiments, the current of the second reference current generators in the pair of second current generators (I) may have an intensity half the current intensity of the first reference current generator.

In one or more embodiments, the logic circuit may include:
  a first pulse generator (e.g. 18a) and a second pulse generator (e.g. 18b) coupled with the first input and the second input of the logic circuit, and
  a latch circuit (e.g. 18c) having set and reset inputs (e.g. SET, RESET) driven by the first pulse generator and the second pulse generator.

In one or more embodiments, the first comparator and the second comparator may be coupled to a first circuit ground (e.g. SGND),
  the pair of second reference current generators and the logic circuit may be coupled to a second circuit ground (e.g. PGND), the second circuit ground floating with respect to the first circuit ground.

In one or more embodiments, the first input and the second input of the logic circuit may be coupled to the first node and the second node via logical inverter circuits.

In one or more embodiments, the second reference current generators in the pair of second reference current generators may be coupled with respective voltage-limiting zener diodes (e.g. DZ1, DZ2).

In one or more embodiments, the first pulse generator and the second pulse generator may include low-pass circuits (e.g. RC) controlling the duration of the set and reset pulses applied to the set and reset inputs of the latch circuit.

In one or more embodiments, the first pulse generator and the second pulse generator may include NAND logic gates (e.g. NAND1, NAND2) with a first input configured for receiving said respective switching signals and a second input configured for receiving delayed (e.g. INV1, INV2) replicas of said respective switching signals.

In one or more embodiments, the first pulse generator and the second pulse generator may include a low-pass network coupled to the second inputs of the NAND logic gates to low-pass filter said delayed replicas.

A device according to one or more embodiments may include:
a circuit according to one or more embodiments, and
a user circuit (e.g. 12, OS) coupled to the output node wherein switching of the output node between a first state and a second state is substantially unaffected by the delayed switching wavefronts of said respective switching signals.

A method of operating a circuit or device according to one or more embodiments may include applying to the differential inputs of the first comparator and the second comparator input signals of opposed polarities including a DC signal (e.g. INM) having superposed thereon a square wave signal (e.g. INP).

Without prejudice to the underlying principles, the details and embodiments may vary, even significantly, with respect to what has been described by way of example only without departing from the extent of protection.

The extent of protection is defined by the annexed claims.

The invention claimed is:

1. A circuit, including:
a first comparator and a second comparator having respective differential inputs configured for receiving input signals of opposed polarities, the first comparator and the second comparator having respective output nodes,
a first reference current generator,
a switch driven by the output nodes of the first and second comparators, the switch having an input coupled to the first reference current generator and configured to transfer a first current output from the first reference current generator alternatively to a first node and a second node in response to the output nodes of the first and second comparators,
a pair of second reference current generators, coupled to the first node and the second node, respectively, wherein second currents of the pair of second reference current generators are applied to the first node and the second node, respectively, with a sign opposite to a sign of the first current, and
a logic circuit having a first input coupled to the first node and a second input coupled to the second node so as to receive first and second switching signals each having fast switching wavefronts and delayed switching wavefronts, wherein the logic circuit includes an output node and is configured to switch the output node between a first state and a second state, wherein switching between the first state and the second state is triggered by the fast switching wavefronts of said first and second switching signals.

2. The circuit of claim 1, wherein the second currents each have an intensity that is half of an intensity of the first current.

3. The circuit of claim 1, wherein the logic circuit comprises:
a first pulse generator coupled to the first input;
a second pulse generator coupled to the second input; and
a latch circuit having set and reset inputs driven by the first pulse generator and the second pulse generator, respectively.

4. The circuit of claim 1, wherein:
the first comparator and the second comparator are coupled to a first circuit ground, and
the pair of second reference current generators and the logic circuit are coupled to a second circuit ground, wherein the second circuit ground is floating with respect to the first circuit ground.

5. The circuit of claim 1, wherein the first input and the second input of the logic circuit are coupled to the first node and the second node via logical inverter circuits.

6. The circuit of claim 1, wherein the pair of second reference current generators are coupled with respective voltage-limiting zener diodes.

7. The circuit of claim 3, wherein the first pulse generator and the second pulse generator include low-pass circuits controlling durations of set and reset pulses applied to the set and reset inputs of the latch circuit.

8. The circuit of claim 7, wherein the first pulse generator and the second pulse generator include NAND logic gates with a first input configured for receiving said respective switching signals and a second input configured for receiving delayed replicas of said respective switching signals.

9. The circuit of claim 8, wherein the first pulse generator and the second pulse generator include a low-pass network coupled to the second inputs of the NAND logic gates to low-pass filter said delayed replicas.

10. The circuit of claim 1, further including a user circuit coupled to the output node wherein switching of the output node between the first state and the second state is substantially unaffected by the delayed switching wavefronts of said respective switching signals.

11. The circuit of claim 1, wherein the input signals of opposed polarities include a DC signal having superposed thereon a square wave signal.

12. A circuit, comprising:
a first current source configured to generate a first current;
a switch having an input configured to receive the first current, a first output and a second output;
a first comparator configured to compare a first input signal to a second input signal and in response thereto cause the switch to connect the input to the first output;
a second comparator configured to compare the second input signal to the first input signal and in response thereto cause the switch to connect the input to the second output;
a second current source configured to sink a second current from the first output;
a third current source configured to sink a third current from the second output; and
a latch circuit having a set input coupled to receive a first signal from the first output and a reset input coupled to receive a second signal from the second output.

13. The circuit of claim 12, further comprising:
a first inverter configured to invert the first signal from the first output before application to the set input; and
a second inverter configured to invert the second signal from the second output before application to the reset input.

14. The circuit of claim 13, wherein the first and second inverters are referenced to a first ground node, and wherein the first and second comparators are referenced to a second ground node, and wherein the second ground node is floating relative to the first ground node.

15. The circuit of claim 12, further comprising:
a first diode coupled in parallel to the second current source; and
a second diode coupled in parallel to the third current source.

16. The circuit of claim 12, wherein the latch circuit is a NAND latch.

17. The circuit of claim 12, further comprising:
a first pulse generator configured to generate a first pulse from the first signal for application to the set input; and
a second pulse generator configured to generate a second pulse from the second signal for application to the reset input.

18. The circuit of claim 17, wherein the first pulse generator and the second pulse generator each include a low-pass circuit configured to control a duration of the first and second pulses, respectively.

* * * * *